United States Patent
Cho et al.

(10) Patent No.: US 7,804,329 B2
(45) Date of Patent: Sep. 28, 2010

(54) INTERNAL CHARGE TRANSFER FOR CIRCUITS

(75) Inventors: Choongyeun Cho, Hopewell Junction, NY (US); Elmer K. Corbin, Hopewell Junction, NY (US); Daeik Kim, White Plains, NY (US); Moon J. Kim, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 120 days.

(21) Appl. No.: 12/275,521

(22) Filed: Nov. 21, 2008

(65) Prior Publication Data

US 2010/0127730 A1 May 27, 2010

(51) Int. Cl.
*H03K 19/094* (2006.01)
(52) U.S. Cl. .......................................... 326/83; 326/27
(58) Field of Classification Search ............. 326/26–28, 326/82–87
See application file for complete search history.

(56) References Cited

U.S. PATENT DOCUMENTS

| | | | |
|---|---|---|---|
| 5,821,769 A | 10/1998 | Douseki | |
| 5,838,047 A | 11/1998 | Yamauchi et al. | |
| 6,404,239 B1 | 6/2002 | Kawahara et al. | |
| 6,535,433 B2 | 3/2003 | Ooishi | |
| 7,039,818 B2 | 5/2006 | Deng et al. | |
| 7,436,205 B2 * | 10/2008 | Tada | 326/33 |
| 7,521,762 B2 * | 4/2009 | Hidaka | 257/369 |
| 7,531,994 B2 * | 5/2009 | Itoh | 323/273 |
| 2003/0080782 A1 | 5/2003 | Bailey et al. | |
| 2006/0022742 A1 | 2/2006 | Parris et al. | |
| 2008/0084775 A1 | 4/2008 | Hoberman et al. | |
| 2008/0122479 A1 | 5/2008 | Hidaka | |

FOREIGN PATENT DOCUMENTS

EP    1863177 A2    12/2007

OTHER PUBLICATIONS

Levacq, D. et al., "Backgate Bias Accelerator for 10ns-order Sleep-to-Active Modes Transition Time," IEEE Asian Solid-State Circuits Conference, Nov. 2007, pp. 296-299.
Kim, K. et al., "Back-Gate Controlled Wide Tunable Range Diode Voltage in Asymmetrical Double-Gate Devices," IEEE International SOI Conference Proceedings, Oct. 2006, pp. 151-152.
Makino, H. et al., "An Auto-Backgate-Controlled MT-CMOS Circuit," 1998 Symposium on VLSI Circuits Digest of Technical Papers, Jun. 1998, pp. 42-43.

* cited by examiner

*Primary Examiner*—Don P Le
(74) *Attorney, Agent, or Firm*—William E. Schiesser; Ronald A. D'Alessandro; Keohane & D'Alessandro PLLC

(57) ABSTRACT

The present invention enables fast transition between sleep and normal modes for circuits such as digital circuits. This invention utilizes chip internal charge transfer operations to put the circuit into fast sleep. The invention reduces external power involvement, and it expedites the sleep mode transition time by limiting charge transfers within the circuit. The fast sleep and fast wake-up enable more efficient power management of the system. This functionality also maximizes performance per power, and provides a more energy efficient computing architecture.

20 Claims, 6 Drawing Sheets

INTERNAL CHARGE TRANSFER FOR CIRCUITS

CROSS-REFERENCE TO RELATED APPLICATIONS

This application is related in some aspects to commonly owned and co-pending Ser. No. 12/275,508, entitled "Mounted Cache Memory in a Multi-Core Processor (MCP)," filed Nov. 21, 2008, the entire contents of which are herein incorporated by reference. This application is also related in some aspects to commonly owned and co-pending Ser No. 12/275,552, entitled "Cache Memory Sharing in a Multi-Core Processor (MCP)," filed Nov. 21, 2008, the entire contents of which are herein incorporated by reference. This application is also related in some aspects to commonly owned and co-pending Ser. No. 12/276,069, entitled "Pseudo Cache Memory in a Multi-Core Processor (MCP)," filed Nov. 21, 2008, the entire contents of which are herein incorporated by reference. This application is also related in some aspects to commonly owned and co-pending Ser. No. 12/276,072, entitled "Cache Memory Bypass in a Multi-Core Processor (MCP)," filed Nov. 21, 2008, the entire contents of which are herein incorporated by reference.

FIELD OF THE INVENTION

The present invention generally relates to circuits. More specifically, the present invention relates to charge transfer for (e.g., digital) circuits.

BACKGROUND OF THE INVENTION

Power conservation is a growing issue in circuitry as the recent trend towards more energy efficient data center design has become an important issue within Information Technology (IT) industry. One area of concern in power conservation has been the change of modes (e.g., from normal to sleep and vice versa) of circuits. Specifically, a subsystem level stand-by (sleep mode) design has been available, but the current circuit design method does not allow for circuit level control of the stand-by operation. Moreover, fast switching between the sleep and normal modes is essential to enable efficient power usage in digital systems. Current methods of sleeping and wake-up are conducted as a long-term static policy.

SUMMARY OF THE INVENTION

Among other things, the present invention enables fast transition between sleep and normal modes for circuits such as digital circuits. This invention utilizes chip internal charge transfer operations to put the circuit into fast sleep. The invention reduces external power involvement, and it expedites the sleep mode transition time by limiting charge transfers within the chip. The invention set forth herein uses high-level circuit block supports and therefore it is applicable to all circuits such as digital circuits. The fast sleep and fast wake-up enable a smarter power management of the system. This functionality also maximizes performance per power, and provides a more energy efficient computing architecture. Among other things, a circuit in accordance with the present invention can include a supply voltage node, a ground voltage node; a set of backgate voltage nodes; and a charge transfer mechanism coupled to the supply voltage node, the ground voltage node, and the set of backgate voltage nodes, the charge transfer mechanism being configured to transfer charge among the supply voltage node, the ground voltage node, and the set of backgate voltage nodes. This allows for rapid wake-up and/or sleep of the circuit and lower power consumption.

A first aspect of the present invention provides a circuit comprising: a supply voltage node; a ground voltage node; a set of backgate voltage nodes; and a charge transfer mechanism coupled to the supply voltage node, the ground voltage node, and the set of backgate voltage nodes, the charge transfer mechanism being configured to transfer charge among the supply voltage node, the ground voltage node, and the set of backgate voltage nodes.

A second aspect of the present invention provides a digital circuit comprising: a supply voltage node; a ground voltage node; a PFET backgate voltage node; a NFET backgate voltage node; and a set of switches coupled to the set of backgate voltage nodes, the supply voltage node, and the ground voltage node, the set of switches being configured to transfer charge: between the supply voltage node and the ground voltage node, between the PFET backgate voltage node and the supply voltage node, and between the NFET backgate voltage node and the ground voltage node.

A third aspect of the present invention provides a method for transferring charge in a circuit, comprising: transferring a supply voltage charge from a supply voltage node to a ground voltage node to put the circuit into a sleep mode; and transferring a backgate voltage charge from a set of backgate voltage nodes to the supply voltage node and the ground voltage node to bring the circuit out of the sleep mode.

A fourth aspect of the present invention provides a method for changing modes of a digital circuit, comprising: closing a first switch in the digital circuit; transferring a supply voltage charge from a supply voltage node to a ground voltage node using the first switch to put the digital circuit into a sleep mode; opening the first switch; closing a second switch and a third switch in the digital circuit; and transferring a backgate voltage charge from a set of backgate voltage nodes to the supply voltage node and the ground voltage node using the second switch and the third switch to bring the digital circuit out of the sleep mode.

BRIEF DESCRIPTION OF THE DRAWINGS

These and other features of this invention will be more readily understood from the following detailed description of the various aspects of the invention taken in conjunction with the accompanying drawings in which.

Figure 1:
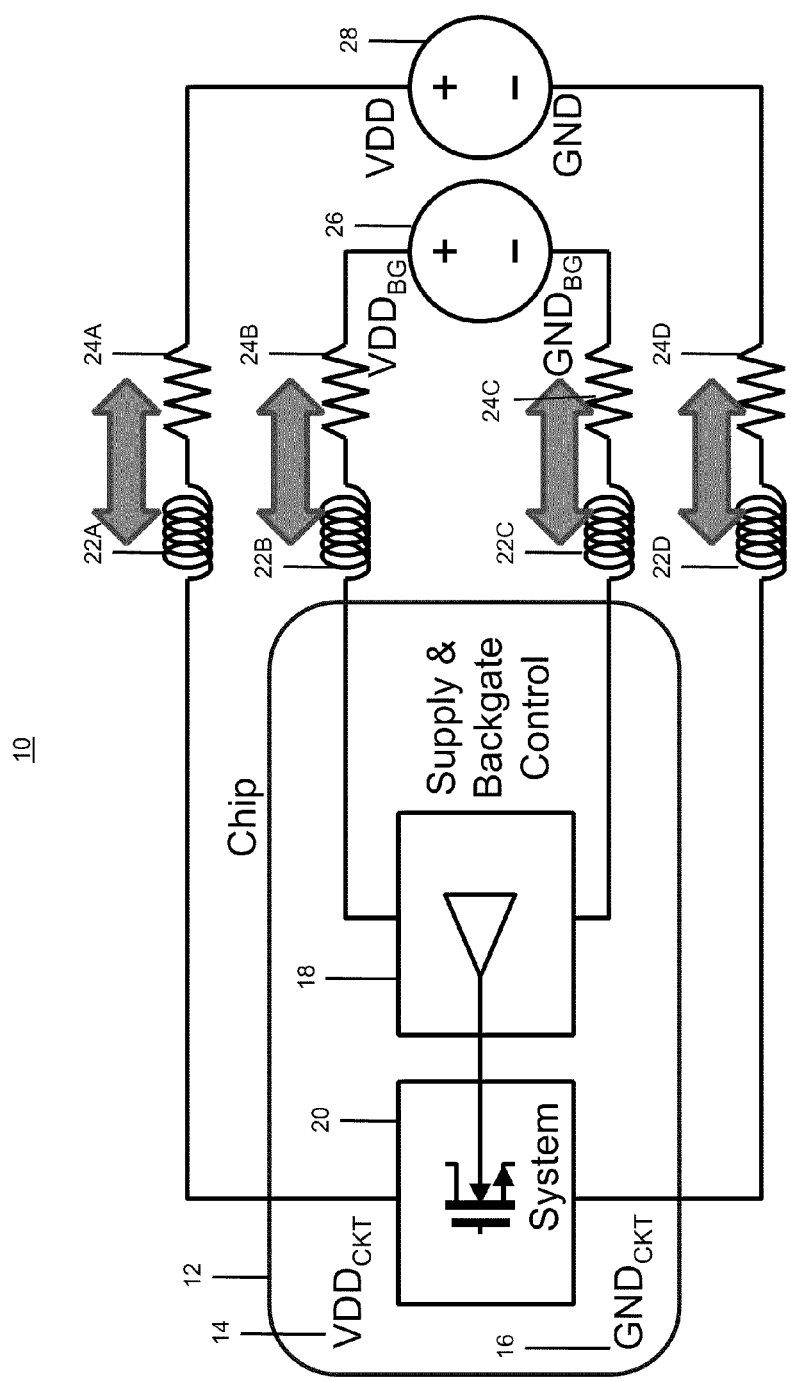
FIG. 1 depicts a circuit.

The drawings are not necessarily to scale. The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION OF THE INVENTION

As indicated above (among other things) the present invention enables fast transition between sleep and normal modes for circuits such as digital circuits. This invention utilizes chip internal charge transfer operations to put the circuit into fast sleep. The invention reduces external power involvement, and it expedites the sleep mode transition time by limiting charge transfers within the chip. The invention set forth herein uses high-level circuit block supports and therefore it is applicable to all circuits such as digital circuits. The fast sleep and fast wake-up enable a smarter power management of the system. This functionality also maximizes performance per power, and provides a more energy efficient computing architecture. Among other things, a circuit in accordance with the present invention can include a supply voltage node, a ground voltage node; a set of backgate voltage nodes; and a charge transfer mechanism coupled to the supply voltage node, the ground voltage node, and the set of backgate voltage nodes, the charge transfer mechanism being configured to transfer charge among the supply voltage node, the ground voltage node, and the set of backgate voltage nodes. This allows for rapid wake-up and/or sleep of the circuit and lower power consumption.

Figure 2:
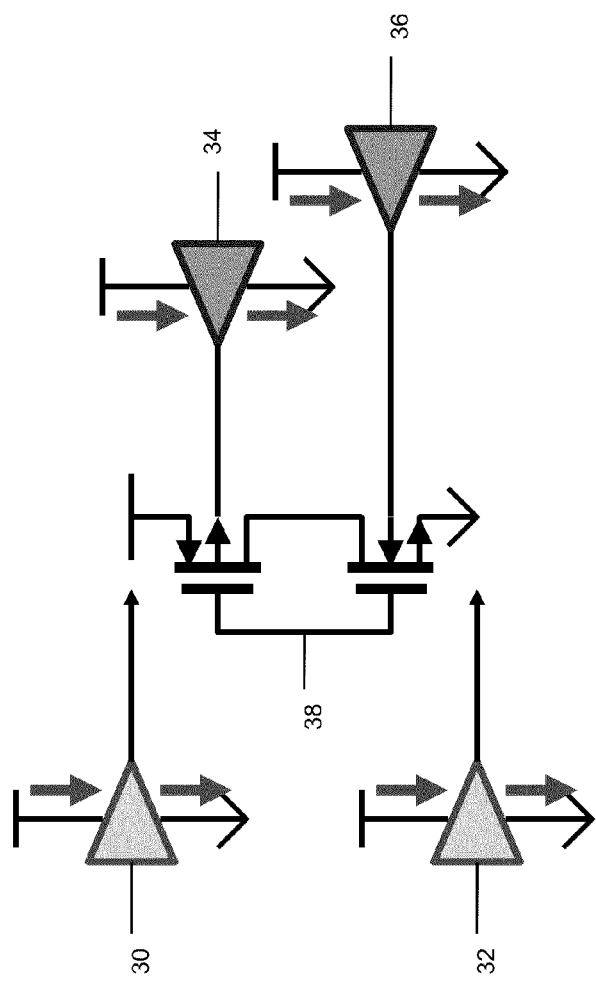
FIG. 2 depicts a method for brining a circuit in and out of a sleep mode.

Referring now to FIG. 1, a circuit 10 is shown. As depicted, circuit 10 comprises chip 12, voltage drain (VDD) 14, ground drain (GND) 16, voltage source 18, logic system 20, inductors 22A-D, resistors 24A-D and power supplies 26 and 28. FIG. 2 shows a method for bringing circuit 10 in and out of sleep mode. As shown, the method shows a voltage control node 30, a ground control node 32, PFET backgate control node 34, NFET backgate control node 36 and CMOS inverter 38. Under this method, all voltage level controls are externally powered. As such, transition between sleep and wake-up involves external power spikes.

Figure 3:
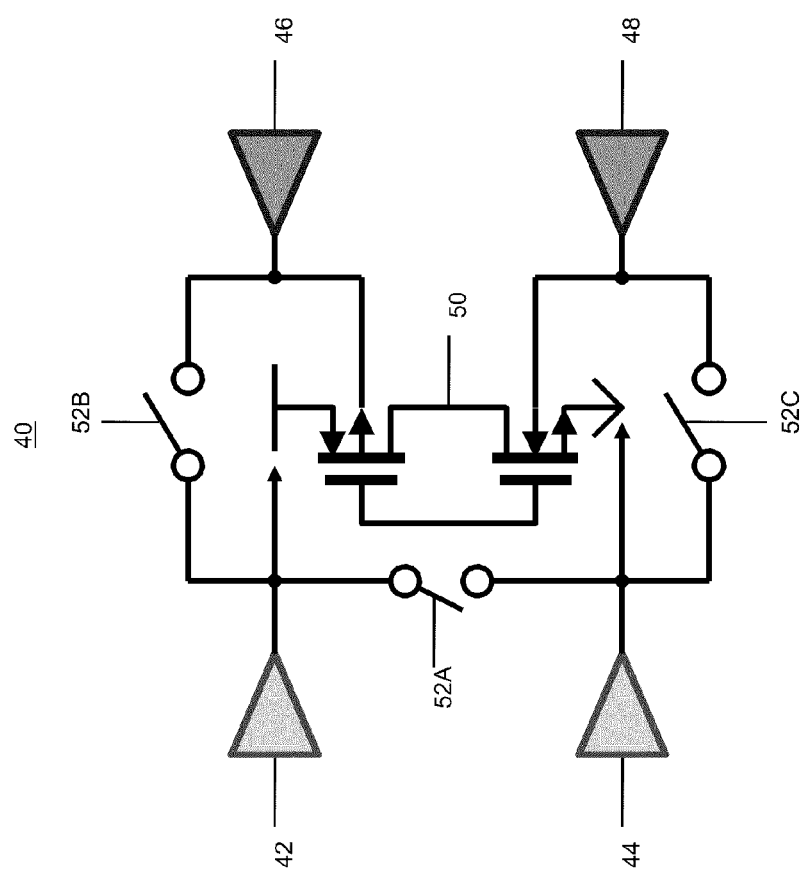
FIG. 3 depicts a schematic of a charge transfer mechanism in accordance with the present invention.

The present invention addresses these issues by providing an internal charge transfer mechanism to so that voltage level controls are internally powered. Referring to FIG. 3, this is shown in greater detail. It should be understood that the circuit of the present invention can include some or all of the components of FIG. 1 (along with additional and/or changed features). In addition, FIGS. 1 and 3 typically pertain to digital circuits, although this need not be the case. In any event, as depicted, circuit 40 includes supply voltage node 42, ground voltage node 44, PFET backgate voltage node 46, NFET backgate voltage node 48, and inverter (digital logic system 50). Also shown is a set (at least one) of switches 52 A-C coupling together these components that serve as the internal charge transfer mechanism for circuit 40. Switch 52A is positioned between supply voltage node 42 and ground voltage node 44. Switches 52A-B are positioned between PFET backgate voltage control node 46 and supply voltage node 42 and between NFET backgate voltage control node 48 and ground voltage node 44, respectively. As such, set of switches directly couple together: supply voltage node 42 and ground voltage node 44; PFET backgate voltage node 46 and supply voltage node 42; and NFET backgate voltage node 48 and ground voltage node 44.

Figure 4:
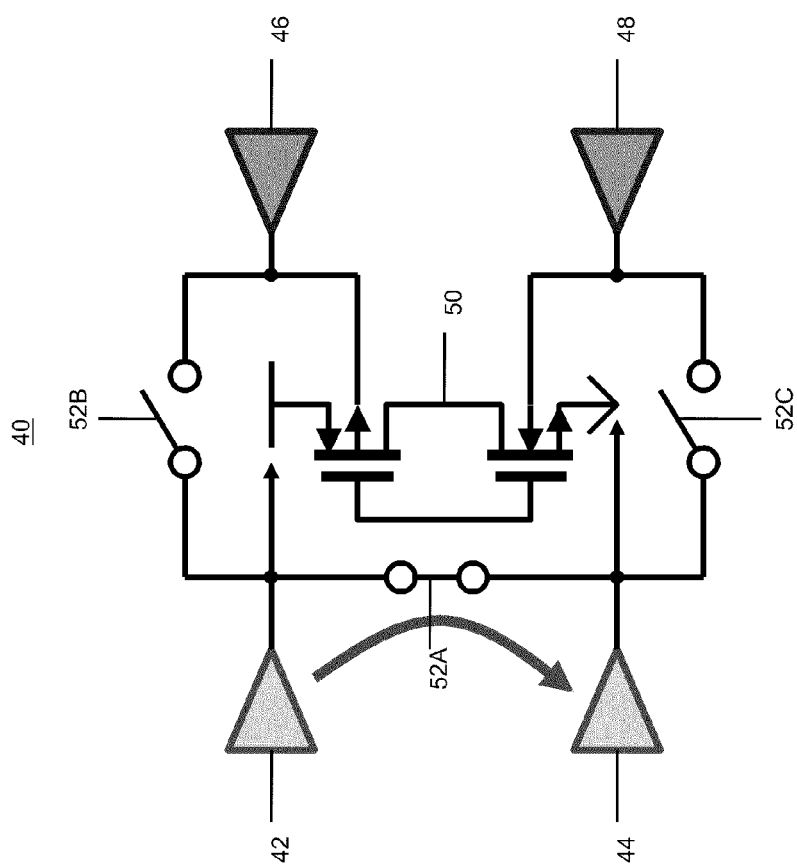
FIG. 4 depicts a method for putting a circuit into sleep mode using the schematic of FIG. 3 in accordance with the present invention.
Figure 5:
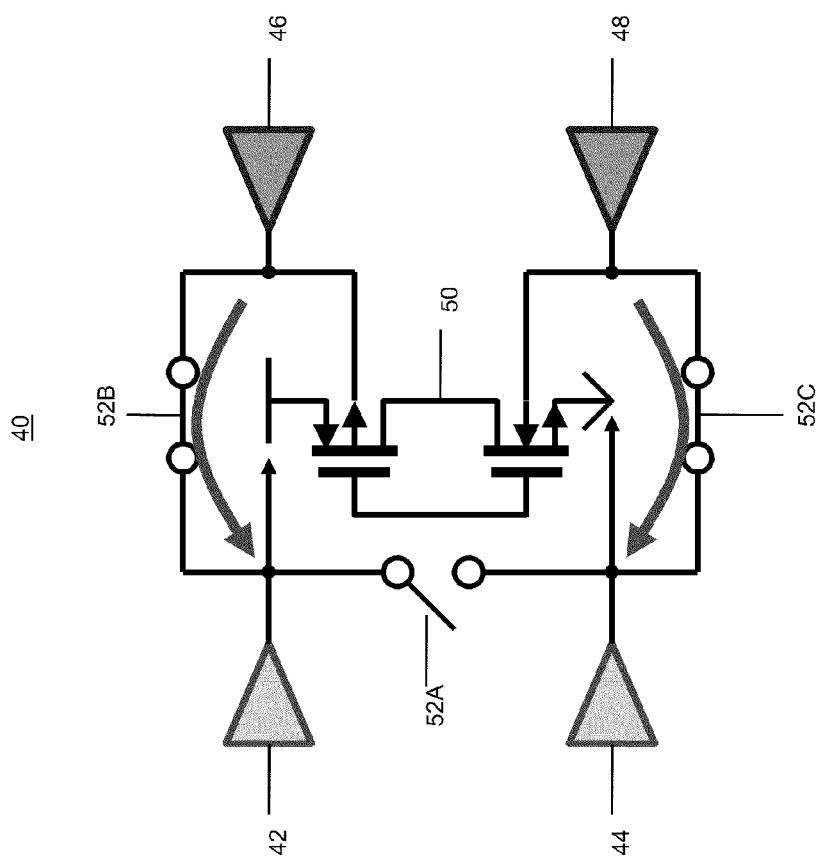
FIG. 5 depicts a method for bringing a circuit out of sleep mode using the schematic of FIG. 3 in accordance with the present invention.

The function of set of switches 52A-C will be explained with specific reference to FIGS. 4-5. Referring first to FIG. 4, when it is desired to put circuit 40 into a sleep mode, switch 52A is closed. At this point, charges in supply voltage node 42 are transferred to ground voltage node 44 internally until it reaches pre or adaptively defined VDD-GND differences for low-power circuit operation. The VDD-GND reduction decreases stand-by power, and the remaining backgate reverse bias re-enforces even lower leakage power. FIG. 5 shows the mechanism involved with going from sleep mode to normal mode. As depicted, switch 52A is open while switches 52B-C are closed. The closing of switches 52B-C causes charges to be transferred: from PFET backgate voltage node 46 to supply voltage node 42; and from NFET backgate voltage node 48 to ground voltage node 44. This internal charge transfer provides 50% of the performance in a matter of nano-seconds.

Figure 6:
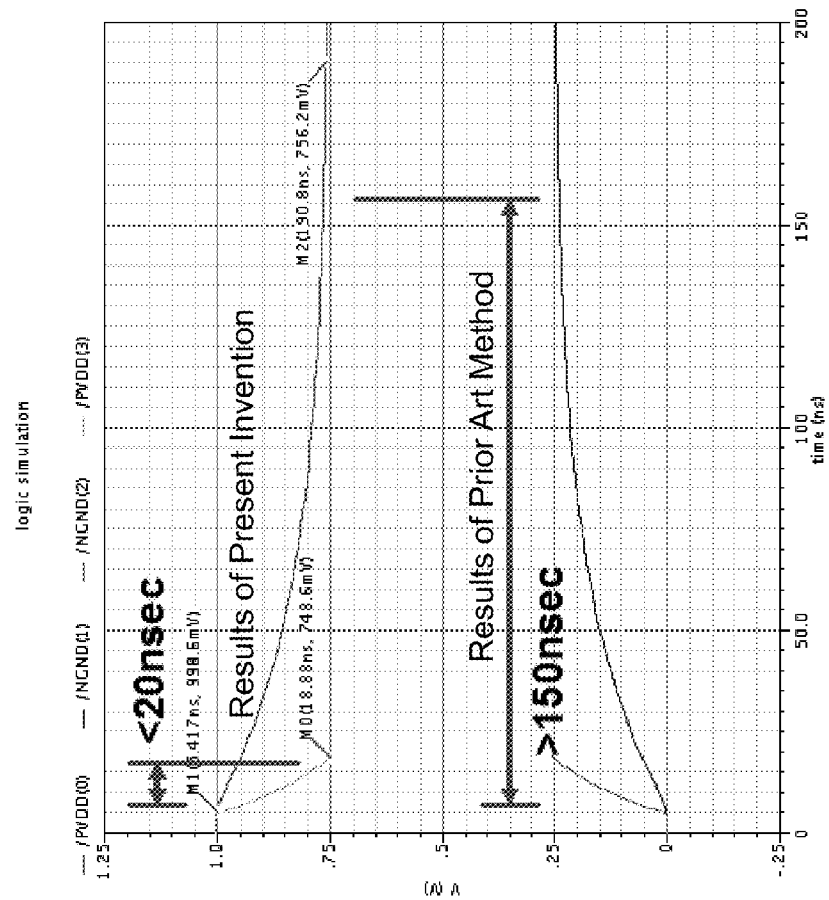
FIG. 6 depicts results of a conventional method versus the method of the present invention.

FIG. 6 shows results from the conventional method of FIG. 2 as well as that from the method of the present invention of FIGS. 1, 3-5. As depicted, the conventional method takes in excess of 150 nano-seconds to transition modes, while the method of present invention takes less than 20 nano-seconds. Among other things, the present invention provides the following advantages:

Fast and efficient sleep/active mode transitions management method
Minimal current spike
Fast sleep mode transition—no current spike, fully internal
Fast wake up
50% internal, no current spike
50% external, minimal spike by gradual sourcing
Less damage to the device
Avoid memory content contamination
>7 times faster sleep mode within <20 nsec
Applicable to generic digital circuits
Opens ways to optimize highly performance/power efficient digital system.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A circuit comprising:
   a supply voltage node;
   a ground voltage node;
   a set of backgate voltage nodes; and
   a charge transfer mechanism coupled to the supply voltage node, the ground voltage node, and the set of backgate voltage nodes, the charge transfer mechanism being configured to transfer charge among the supply voltage node, the ground voltage node, and the set of backgate voltage nodes.

2. The circuit of claim 1, the charge transfer mechanism being configured to transfer charge from the supply voltage node to the ground voltage node to put the circuit into a sleep mode.

3. The circuit of claim 1, the charge transfer mechanism being configured to transfer charge from the set of backgate voltage nodes to the ground voltage node and the supply voltage node to bring the circuit out of a sleep mode.

4. The circuit of claim 1, further comprising a logic system communicating with the set of backgate voltage nodes, the supply voltage node, and the ground voltage node.

5. The circuit of claim 1, the charge transfer mechanism comprising a set of switches, the set of switches coupling together the set of backgate voltage nodes, the supply voltage node, and the ground voltage node when closed.

6. The circuit of claim 1, the set of backgate voltage nodes comprising a PFET backgate voltage node and a NFET backgate voltage node.

7. The circuit of claim 6, the set of switches comprising:
a first switch positioned between the supply voltage node and the ground voltage node;
a second switch positioned between the PFET backgate voltage node and the supply voltage node; and
a third switch positioned between the NFET backgate voltage node and the ground voltage node.

8. A digital circuit comprising:
a supply voltage node;
a ground voltage node;
a PFET backgate voltage node;
a NFET backgate voltage node; and
a set of switches coupled to the set of backgate voltage nodes, the supply voltage node, and the ground voltage node, the set of switches being configured to transfer charge:
  between the supply voltage node and the ground voltage node,
  between the PFET backgate voltage node and the supply voltage node, and
  between the NFET backgate voltage node and the ground voltage node.

9. The digital circuit of claim 8, the set of switches transferring the charge to bring the digital circuit in and out of a sleep mode.

10. The digital circuit of claim 8, further comprising a digital logic system coupling together the set of backgate voltage nodes, the supply voltage node, and the ground voltage node.

11. The digital circuit of claim 8, a set of switches comprising:
a first switch positioned between the supply voltage node and the ground voltage node;
a second switch positioned between the PFET backgate voltage node and the supply voltage node; and
a third switch positioned between the NFET backgate voltage node and the ground voltage node.

12. A method for transferring charge in a circuit, comprising:
transferring a supply voltage charge from a supply voltage node to a ground voltage node to put the circuit into a sleep mode; and
transferring a backgate voltage charge from a set of backgate voltage nodes to the supply voltage node and the ground voltage node to bring the circuit out of the sleep mode.

13. The method of claim 12, further comprising a logic system communicating with the set of backgate voltage nodes, the supply voltage node, and the ground voltage node.

14. The method of claim 12, the transferring of the supply voltage charge and the backgate voltage charge being enabled via a set of switches in the circuit, the set of switches coupling together the set of backgate voltage nodes, the supply voltage node, and the ground voltage node.

15. The method of claim 14, the set of backgate voltage nodes comprising a PFET backgate voltage node and an NFET backgate voltage node.

16. The method of claim 15, the set of switches comprising:
a first switch positioned between the supply voltage node and the ground voltage node;
a second switch positioned between the PFET backgate voltage node and the supply voltage node; and
a third switch positioned between the NFET backgate voltage node and the ground voltage node.

17. The method of claim 16, the transferring of the supply voltage charge comprising closing the first switch.

18. The method of claim 16, the transferring of the backgate voltage charge comprising closing the second switch and the third switch.

19. A method for changing modes of a digital circuit, comprising:
closing a first switch in the digital circuit;
transferring a supply voltage charge from a supply voltage node to a ground voltage node using the first switch to put the digital circuit into a sleep mode;
opening the first switch;
closing a second switch and a third switch in the digital circuit; and
transferring a backgate voltage charge from a set of backgate voltage nodes to the supply voltage node and the ground voltage node using the second switch and the third switch to bring the digital circuit out of the sleep mode.

20. The method of claim 19:
the first switch being positioned between the supply voltage node and the ground voltage node;
the second switch being positioned between a PFET backgate voltage node and the supply voltage node; and
a third switch being positioned between a NFET backgate voltage node and the ground voltage node.

* * * * *